US011742326B2

(12) United States Patent
Talanov et al.

(10) Patent No.: US 11,742,326 B2
(45) Date of Patent: Aug. 29, 2023

(54) STACKED SUPERCONDUCTING INTEGRATED CIRCUITS WITH THREE DIMENSIONAL RESONANT CLOCK NETWORKS

(71) Applicant: Microsoft Technology Licensing, LLC, Redmond, WA (US)

(72) Inventors: Vladimir V. Talanov, Ellicott City, MD (US); Anna Y. Herr, Ellicott City, MD (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 275 days.

(21) Appl. No.: 17/134,743

(22) Filed: Dec. 28, 2020

(65) Prior Publication Data

US 2022/0208726 A1 Jun. 30, 2022

(51) Int. Cl.
*H03K 19/00* (2006.01)
*H01L 25/065* (2023.01)
(Continued)

(52) U.S. Cl.
CPC ............ *H01L 25/0657* (2013.01); *G06F 1/10* (2013.01); *H01L 23/66* (2013.01); *H01P 3/081* (2013.01);
(Continued)

(58) Field of Classification Search
CPC . H01L 23/66; H01L 27/18; H01L 2223/6616; H01L 2223/6627;
(Continued)

(56) References Cited

U.S. PATENT DOCUMENTS 9,595,970 B1 3/2017 Reohr et al.
9,722,589 B1 8/2017 Talanov et al.
(Continued)

OTHER PUBLICATIONS

"International Search Report and Written Opinion Issued in PCT Application No. PCT/US2021/043288", dated Oct. 29, 2021, 10 Pages.
(Continued)

*Primary Examiner* — Tuan T Lam
(74) *Attorney, Agent, or Firm* — Ranjeev Singh; Singh Law, PLLC

(57) ABSTRACT

Stacked superconducting integrated circuits with three dimensional resonant clock networks are described. An apparatus, including a first superconducting integrated circuit having a first clock distribution network for distributing a first clock signal in the first superconducting integrated circuit, is provided. The apparatus further includes a second superconducting integrated circuit, stacked on top of the first superconducting integrated circuit, having a second clock distribution network for distributing a second clock signal in the second superconducting integrated circuit, where each of the first clock distribution network and the second clock distribution network comprises a clock structure having a plurality of unit cells, where each of the plurality of unit cells includes at least one spine and at least one stub, the at least one stub inductively coupled to a first superconducting circuit, and where each of the first clock signal and the second clock signal has a same resonant frequency.

20 Claims, 7 Drawing Sheets

(51) Int. Cl.
*G06F 1/10* (2006.01)
*H01L 23/66* (2006.01)
*H01P 3/08* (2006.01)
*H03K 19/20* (2006.01)
*H10N 69/00* (2023.01)

(52) U.S. Cl.
CPC ............ *H03K 19/20* (2013.01); *H10N 69/00* (2023.02); *H01L 2223/6616* (2013.01); *H01L 2223/6627* (2013.01); *H01L 2225/06513* (2013.01); *H01L 2225/06541* (2013.01)

(58) Field of Classification Search
CPC . H01L 2225/06513; H01L 2225/06541; H01P 3/081; H03K 19/20
See application file for complete search history.

(56) References Cited

U.S. PATENT DOCUMENTS

| | | | | |
|---|---|---|---|---|
| 10,431,867 | B1* | 10/2019 | Strong | G06F 1/105 |
| 2005/0023518 | A1 | 2/2005 | Herr | |
| 2009/0020863 | A1* | 1/2009 | Choi | H01L 25/0657 257/686 |
| 2010/0277210 | A1* | 11/2010 | Wang | H03L 7/099 327/147 |
| 2016/0163424 | A1* | 6/2016 | Wang | H10N 60/0688 174/268 |
| 2019/0097118 | A1* | 3/2019 | Rouse | H01L 21/76828 |
| 2020/0266234 | A1* | 8/2020 | Boothby | H01L 28/60 |

OTHER PUBLICATIONS

Yoshida, et al. "Radiation Characteristics of Zeroth-Order Resonators Composed of 2-D Dielectric-Based Composite Right/Left Handed Metamaterial Structures", In Proceedings of European Microwave Conference (EuMC), Sep. 29, 2009, pp. 205-208.

Obeng, Yaw S. "Metrology for Emerging Integrated Systems", Retrieved From: https://www.nist.gov/programs-projects/metrology-emerging-integrated-systems, Sep. 23, 2014, 4 Pages.

Caloz, et al., "Metamaterials for High-Frequency Electronics", In Proceedings of the IEEE, vol. 93, Issue 10, Oct. 2005, pp. 1744-1752.

Drake, et al., "Resonant Clocking Using Distributed Parasitic Capacitance", In IEEE Journal of Solid-State Circuits, vol. 39, Issue 9, Sep. 2004, pp. 1520-1528.

Herr, et al., "Ultra-Low-Power Superconductor Logic", In Repository of arXiv:1103.4269v1, Mar. 22, 2011, 7 Pages.

Klein, et al., "The Effective Microwave Surface Impedance of High-Tc Thin Films", In Journal of Applied Physics, vol. 67, Issue 11, Jun. 1, 1990, pp. 6940-6945.

Likharev, et al., "RSFQ Logic/Memory Family: A New Josephson-Junction Technology for Sub-Terahertz-Clock-Frequency Digital Systems", In Journal of IEEE Transactions on Applied Superconductivity, vol. 1, Issue 1, Mar. 1991, pp. 3-28.

Liu, et al., "Metamaterial Transmission line and its Applications", In Book of Advanced Microwave and Millimeter Wave Technologies Semiconductor Devices Circuits and Systems, Mar. 1, 2010, 27 Pages.

Mesgarzadeh, Behzad, "Simultaneous Switching Noise Reduction by Resonant Clock Distribution Networks", In Journal of Integration, vol. 47, Issue 2, Mar. 1, 2014, 2 Pages.

Oberg, Oliver T., "Superconducting Logic Circuits Operating with Reciprocal Magnetic Flux Quanta", In Dissertation Submitted for Doctor of Philosophy, 2011, 337 Pages.

Park, et al., "Epsilon Negative Zeroth-Order Resonator Antenna", In Journal of IEEE Transactions on Antennas and Propagation, vol. 55, Issue 12, Dec. 6, 2007, pp. 3710-3712.

Sanada, et al., "Novel Zeroth-Order Resonance in Composite Right/Left-Handed Transmission Line Resonators", In Proceedings of Asia-Pacific Microwave Conference, vol. 3, Nov. 4, 2003, 4 Pages.

Soorya, et al., "Zero Delay Clocking System in GHz Frequency Regime using CRLH Metamaterial Structure", In Proceedings of International Conference on Devices, Circuits and Systems, Mar. 15, 2012, 5 Pages.

Talanov, et al., "Measurement of the Absolute Penetration Depth and Surface Resistance of Superconductors and Normal Metals with the Variable Spacing Parallel Plate Resonator", In Journal of Review of Scientific Instruments, vol. 71, Issue 5, May 2000, pp. 2136-2146.

* cited by examiner

STACKED SUPERCONDUCTING INTEGRATED CIRCUITS WITH THREE DIMENSIONAL RESONANT CLOCK NETWORKS

BACKGROUND

Semiconductor based integrated circuits used in electronic devices, such as digital processors, include digital circuits based on complimentary metal-oxide semiconductor (CMOS) technology. CMOS technology, however, is reaching its limits in terms of the device size. In addition, power consumption at high clock speeds by digital circuits based on the CMOS technology has increasingly become a limiting factor in high performance digital circuits and systems.

As an example, servers in a data center are increasingly consuming large amounts of power. The consumption of power is partly the result of power loss from the dissipation of energy even when the CMOS circuits are inactive. This is because even when such circuits are inactive, and are not consuming any dynamic power, they still consume power because of the need to maintain the state of CMOS transistors. In addition, because CMOS circuits are powered using DC voltage, there is a certain amount of current leakage even when the CMOS circuits are inactive. Thus, even when such circuits are not processing information, certain amount of power is wasted not only as a result of the requirement to maintain the state of the CMOS transistors, but also as a result of the current leakage.

An alternative approach to the use of processors and related components, based on CMOS technology, is the use of superconducting integrated circuits. Superconducting integrated circuits can also be combined with integrated circuits having CMOS technology. Clock and power distribution in superconducting integrated circuits requires a different approach.

SUMMARY

In one example, the present disclosure relates to an apparatus comprising a first superconducting integrated circuit having a first clock distribution network for distributing a first clock signal in the first superconducting integrated circuit. The apparatus may further include a second superconducting integrated circuit, stacked on top of the first superconducting integrated circuit, having a second clock distribution network for distributing a second clock signal in the second superconducting integrated circuit, where each of the first clock distribution network and the second clock distribution network comprises a clock structure having a plurality of unit cells, where each of the plurality of unit cells includes at least one spine and at least one stub, the at least one spine connected to the at least one stub, the at least one stub further inductively coupled to at least one first superconducting circuit, and where each of the first clock signal and the second clock signal has a same resonant frequency.

In another aspect, the present disclosure relates to an apparatus comprising a first superconducting integrated circuit having a first clock distribution network for distributing a first clock signal in the first superconducting integrated circuit, where the first superconducting integrated circuit comprises a first plurality of reciprocal quantum logic gates. The apparatus may further include a second superconducting integrated circuit, stacked on top of the first superconducting integrated circuit, having a second clock distribution network for distributing a second clock signal in the second superconducting integrated circuit, where the second superconducting integrated circuit comprises a second plurality of reciprocal quantum logic gates, where each of the first clock distribution network and the second clock distribution network comprises a clock structure having a plurality of unit cells, where each of the plurality of unit cells includes at least one spine and at least one stub, the at least one spine connected to the at least one stub, the at least one stub further inductively coupled to at least one first superconducting circuit, and where each of the first clock signal and the second clock signal has a same resonant frequency.

In yet another aspect, the present disclosure relates to an apparatus comprising a first superconducting integrated circuit having a first clock distribution network for distributing a first clock signal in the first superconducting integrated circuit. The apparatus may further include a second superconducting integrated circuit, stacked on top of the first superconducting integrated circuit, having a second clock distribution network for distributing a second clock signal in the second superconducting integrated circuit, where the first clock distribution network and the second clock distribution network form a volumetric zeroth-order resonator, where each of the first clock distribution network and the second clock distribution network comprises a clock structure having a plurality of unit cells, where each of the plurality of unit cells includes at least one spine and at least one stub, the at least one spine connected to the at least one stub, the at least one stub further inductively coupled to at least one first superconducting circuit, where each of the first clock signal and the second clock signal has a same resonant frequency, where the first clock distribution network comprises a first plurality of metamaterial transmission lines (MTLs) and the second clock distribution network comprises a second plurality of MTLs, and where a first plurality of spines associated with the first plurality of MTLs is coupled to a second plurality of spines associated with the second plurality of MTLs via at least one through-silicon via.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
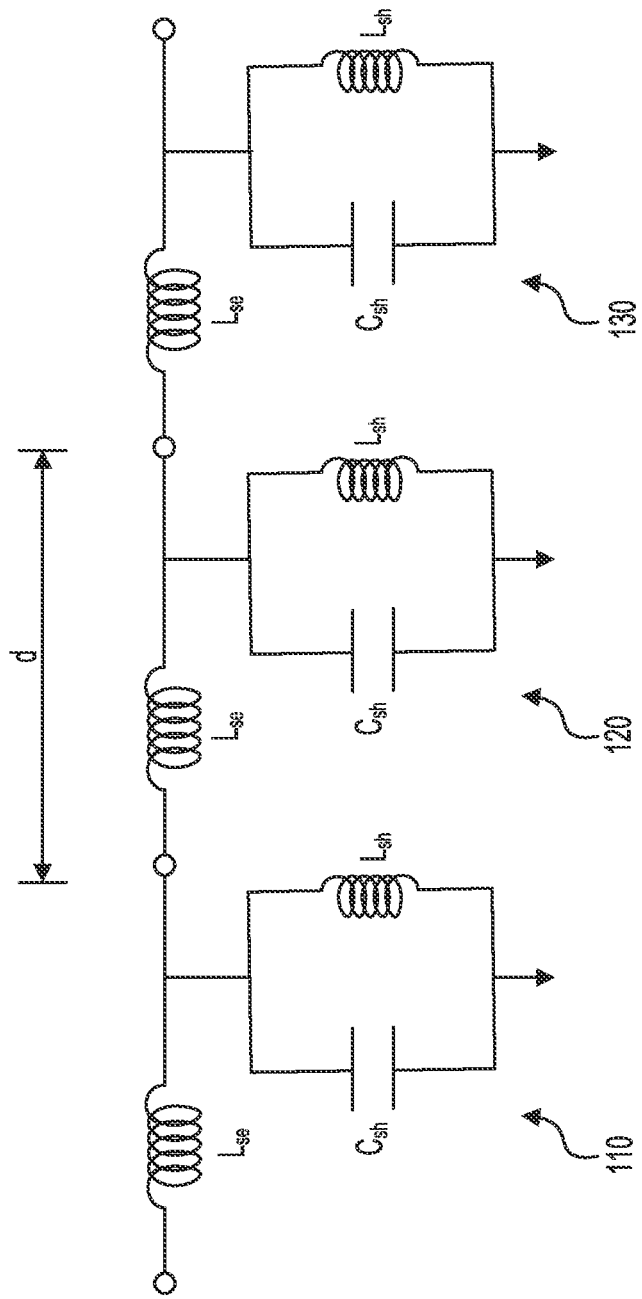
FIG. 1 shows an electrical schematic corresponding to a metamaterial transmission line (MTL) formed using a chain of identical unit cells in accordance with one example.

Examples described in this disclosure relate to stacked superconducting integrated circuits. Certain examples further relate to distributing clock signals and power signals in stacked superconducting integrated circuits with resonant clock networks. Certain examples further relate to a volumetric zeroth-order resonator capable of distributing the clock and power with uniform amplitude and phase to potentially dozens of superconducting integrated circuit chips forming a vertical stack of chips.

Certain examples further relate to reciprocal quantum logic (RQL) based superconducting integrated circuits. Such RQL based integrated circuits may include RQL circuits that may act as low-power superconductor logic circuits. Unlike CMOS transistors, the RQL circuits are superconductor circuits that use Josephson junction based devices. An exemplary Josephson junction may include two superconductors coupled via a region that impedes current. The region that impedes current may be a physical narrowing of the superconductor itself, a metal region, or a thin insulating barrier. As an example, the Superconductor-Insulator-Superconductor (SIS) type of Josephson junctions may be implemented as part of the RQL circuits. As an example, superconductors are materials that can carry a direct electrical current (DC) in the absence of an electric field. Such materials have zero resistance below a critical temperature (Tc). An example superconductor Niobium has a critical temperature (Tc) of 9.3 Kelvin. At temperatures below Tc, Niobium is superconductive; however, at temperatures above Tc, it behaves as a normal metal with electrical resistance. Thus, in the SIS type of Josephson junctions, superconductors may be Niobium superconductors and insulators may be $Al_2O_3$ barriers. In SIS type of junctions, when a wave function tunnels through the barrier, a changing phase difference in time in the two superconductors creates a potential difference between the two superconductors. In RQL circuits, in one example, the SIS type of junction may be part of a superconducting loop. When the potential difference between the two superconductors is integrated with respect to time over one cycle of phase change, the magnetic flux through the loop changes by an integer multiple of a single quantum of magnetic flux. The voltage pulse associated with the single quantum of magnetic flux is referred to as a single-flux-quantum (SFQ) pulse. As an example, overdamped Josephson junctions can create individual single-flux-quantum (SFQ) pulses. In RQL circuits, each Josephson junction may be part of one or more superconducting loops. The phase difference across the junction may be modulated by the magnetic flux applied to the loop.

Various RQL circuits, including transmission lines, can be formed by coupling multiple Josephson junctions by inductors or other components, as needed. SFQ pulses can travel via these transmission lines under the control of at least one clock. The SFQ pulses can be positive or negative. As an example, when a sinusoidal bias current is supplied to a junction, then both positive and negative pulses can travel rightward, during opposite clock phases, on a transmission line. The RQL circuits may advantageously have zero static power dissipation because of the absence of bias resistors. In addition, the RQL circuits may be powered using alternating current (AC) power thereby eliminating the ground return current. The AC power supply may also act as a stable clock reference signal for the RQL circuits. In one example, the digital data may be encoded using a pair of positive and negative (reciprocal) SFQ pulses. As an example, a logical one bit may be encoded as a reciprocal pair of SFQ pulses generated in the positive and negative phases of a sinusoidal clock. A logical zero bit may be encoded by the absence of positive/negative pulse pairs during a clock cycle. The positive SFQ pulse may arrive during the positive part of the clock, whereas the negative pulse may arrive during the negative part of the clock.

The building blocks of exemplary RQL circuits may include various types of logic gates. Exemplary logic gates include an AND gate, an OR gate, a logical A-and-not-B (AanB) gate and a logical AND/OR gate. The AanB gate may have two inputs and one output (Q). An input pulse A may propagate to output Q when favorable clock conditions may be present on an output Josephson transmission line (JTL), unless an input pulse B comes first with respect to either input pulse A or the favorable clock conditions on the output JTL. In some instances, if the input pulse B arrives after the input pulse A, but before the favorable clock conditions at the output JTL, the input pulse A may appear to propagate through the AanB gate, but may be suppressed before favorable clock conditions allow it to propagate. The AND/OR gate may have two inputs and two outputs (Q1 and Q2). The first input pulse, input pulse A or input pulse B, goes to output Q1 and the second input pulse goes to output Q2. The logical behavior of these gates is based on the reciprocal data encoding mentioned earlier. As an example, a positive pulse changes the internal flux state of the inductive loop, but the trailing negative pulse erases the internal state every clock cycle, which in turn produces combinational logic behavior.

Superconducting integrated circuits increasingly require a large number of superconducting logic gates. One way to increase the density of the superconducting logic gates per unit area is to reduce the feature size of the gates using various fabrication techniques. Another way to increase the density of the superconducting logic gates per unit area is to stack superconducting integrated circuit chips, dies, or wafers vertically and interconnect them vertically using through-silicon vias. The clock and power to the superconducting circuits still needs to be delivered in a way that the superconducting logic gates can be powered by the clock signal. Currently, RQL-logic based superconducting integrated circuits have a relatively low density of logic and memory gates (~100 k/cm2) in comparison to the conventional semiconductor integrated circuits (~1B/cm2). While multi-chip modules (MCMs) allow for the integration of many RQL-logic based superconducting integrated circuit chips onto a single silicon substrate, this arrangement adds significant signal propagation delay, which lowers computing efficiency. Advantageously, a through-silicon vias (TSVs) based integration of the RQL-logic based superconducting integrated circuit chips improves the computing efficiency. Any problems associated with ohmic losses in silicon are alleviated in superconducting integrated circuits because at cryogenic temperatures even highly doped silicon becomes a low loss dielectric. In addition, ultra-low-power superconducting integrated circuit chips that do not generate much heat, such as the RQL-logic based superconducting integrated circuits, can have a vertical stack of chips that can be as tall as practical. Examples described in the present disclosure allow for efficient clock and power distribution in such vertical stacks.

In one example, the clock signals to the superconducting circuits in a stack of integrated circuits may be provided by a harmonic radio frequency signal that may have a frequency in a range between 100 MHz to 100 GHz. Resonant clock networks (RCNs) may be used to distribute a clock signal that provides both power and clock to the superconducting circuits. A clock network may deliver the clock signal to several taps distributed throughout a superconducting integrated circuit. The clock signal delivered at each tap needs to be substantially equal in amplitude and refer to a common phase with a high degree of precision. Such RCNs may advantageously use lower power by using metamaterial transmission lines (MTLs) as the clock structures.

FIG. 1 shows an electrical schematic corresponding to a metamaterial transmission line (MTL) 100 formed using a chain of identical unit cells in accordance with one example. In this example, MTL 100 is shown with three unit cells 110, 120, and 130, where d is the unit cell length. Each unit cell may be a passive microwave circuit having one or two inductive stubs, forming clock-lines, along a spine. Each stub may be formed using a short-circuited transmission line (e.g., a microstrip) that is approximately $\lambda/4$ long and provides effective shunt inductance per unit cell ($L_{sh}$). The spine of the clock structure may provide for the shunt capacitance per unit cell ($C_{sh}$), and the series inductance per unit cell ($L_{se}$). The respective per unit length shunt inductance ($L'_{sh}$) for MTL 100 may be represented by the equation: $L'_{sh}=L_{sh}/d$. The per unit shunt capacitance ($C'_{sh}$) for MTL 100 may be represented by the equation: $C'_{sh}=C_{sh}/d$. The per unit series inductance ($L'_{se}$) may be represented by the equation: $L'_{se}=L_{se}/d$. Assuming a general transmission line with a distributed series impedance per unit length (Z') and a distributed shunt admittance per unit length (Y'), its characteristic impedance ($Z_0$) (in this example $Z_0$ may correspond to the impedance of the spine of the MTL) may be represented as $\sqrt{Z'/Y'}$. Further, assuming $\alpha$ as the attenuation constant for the general transmission line and $\beta$ as the phase constant, the complex propagation constant $\gamma$ of the transmission line may be represented as: $\alpha+i\beta=\sqrt{Z'Y'}$. For MTL 100 of FIG. 1, for a clock signal having a frequency of $\omega$, the distributed series impedance per unit length (Z') may be represented as: $i\omega L'_{se}$ and the distributed shunt admittance per unit length (Y') may be represented as: $i\omega C'_{sh} - i/\omega L'_{sh}$, where i is the imaginary unit and $\omega$ is the resonant frequency of the microwave signal being used to dock the MTL. By inserting certain equations into the others, the phase constant may be represented as:

$$\beta = \frac{1}{d}\frac{\sqrt{\omega^2 - \omega_0^2}}{\omega_R}, \text{ where } \omega_0 = \frac{1}{\sqrt{L_{sh}C_{sh}}}$$

(the resonant frequency of a unit cell) and $$\omega_R = \frac{1}{\sqrt{L_{se}C_{sh}}}.$$

Assuming, in this example, an MTL resonator is formed by using N-unit cells that is open-circuited at both ends and N is substantially greater than 1, the resonant condition of the MTL resonator may be represented as $\beta L=\pi n$, where L=Nd is the length of the MTL resonator, and n=0, 1, 2, 3 . . . is the mode index. Inserting the $$\beta = \frac{1}{d}\frac{\sqrt{\omega^2 - \omega_0^2}}{\omega_R}$$

into the equation and solving for the nth mode resonant frequency yields (in the low-spatial-frequency limit of $$n << N)\omega_n = \sqrt{\omega_0^2 + \omega_R^2\left(\frac{\pi n}{N}\right)2}.$$

The clock structure (e.g., the MTL) may support zeroth-order resonance (ZOR) at a finite frequency, whose wavelength may be infinite along the direction of the spine, but finite along the direction of the stubs. In this example, the zeroth-order resonance (ZOR) may occur with the mode index n=0 and when the resonant frequency ($\omega_0$) equals the frequency of the clock used to clock the superconducting circuits. In one example, the zeroth-order resonance (ZOR) may occur at the band edge when the $\beta$ (the phase constant) equals zero, the MTL's effective permittivity is zero, the phase velocity is infinite, and the group velocity is zero.

The clock structure may be designed to resonate at the reciprocal quantum logic (RQL) clock frequency, e.g., the clock frequency that the RQL circuits need clocking at. Advantageously, each stub may carry radio frequency current with an almost identical amplitude and phase. As the spine is configured to carry substantially no current, all of the ohmic losses may be confined to the stubs only. This may advantageously provide for an RCN with up to 90% power efficiency. In addition, because ZOR provides for no amplitude and phase variation along the spine, the RCN may be advantageously scaled up to a sufficiently large number of stubs that cover the entire chip area of the stacked superconducting integrated circuits.

The clock signal may be a sinusoidal clock that may provide AC power to the superconducting logic circuits. Two such clocks may provide a four-phase clock. In one example, cross-wired transformers (not shown) may be used to produce a four-phase clock from two clock signals. For example, by coupling the clock lines to the Josephson junctions in the gates of a respective superconducting circuit in a wound or counter-wound fashion, four phases of clock may be derived. The four phases of the clock may provide directionality to the single flux quantum (SFQ) pulses. Thus, as an example, with respect to a four-phase clock, the positive pulse may ride the leading edge of the clock from one phase to the next and arrive at the output after one cycle of delay and the negative pulse may follow with half a cycle of separation.

Clock distribution to various superconducting circuit components (e.g., RQL circuit components) in a set of stacked chips may be accomplished by coupling current in the clock line, via RF bias transformers, to the superconducting circuits. Each chip may be required to be clocked at the same frequency. To ensure even amplitude and phase distribution of power across the entire chip, resonance clock networks (RCNs) may be used. An RCN may employ the standing wave resonance property to reduce clock delay. Since all of the alternating currents in an RCN are due to a standing wave, there may not be any phase variation from one part of the chip to another part of the chip or even among chips stacked on each other.

Figure 2:
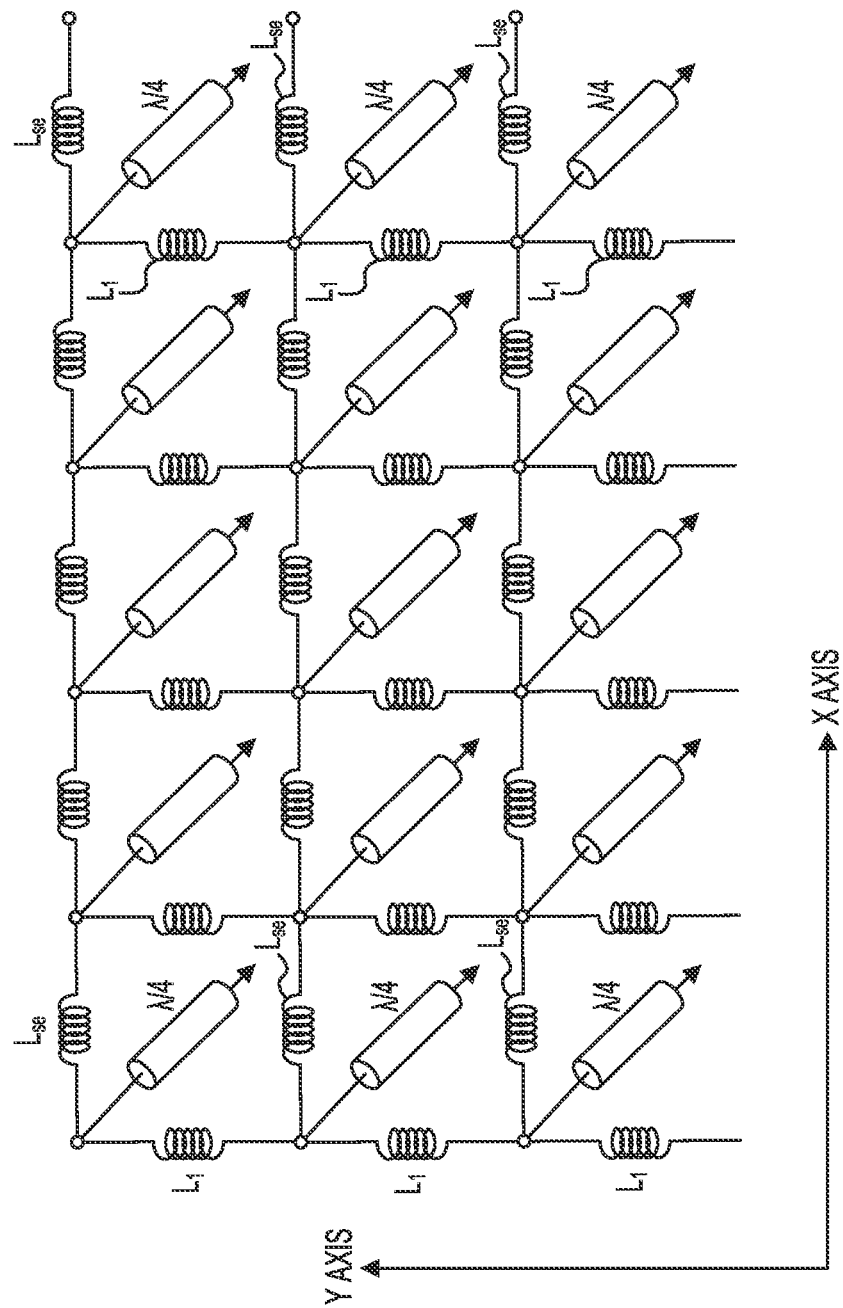
FIG. 2 shows a diagram of a three-dimensional zeroth-order resonator (3D-ZOR) including MTLs in accordance with one example.

FIG. 2 shows a diagram of a three-dimensional zeroth-order resonator (3D-ZOR) 200 including MTLs in accordance with one example. In this example, 3D-ZOR 200 may include multiple MTLs connected along the Y axis with identical lumped inductor elements ($L_1$). In this example, together the inductor elements $L_1$ and $L_{se}$, for the two-dimensional spine, may serve as a two-dimensional antinode. Each inductor element $L_1$ may form a one-dimensional spine along the Y axis direction and each inductor element with the series inductance per unit cell ($L_{se}$) may form a one-dimensional spine in the X axis direction. The inductances $L_1$ and $L_{se}$ may be of the same magnitude or they may have a different magnitude. In this example, the resonant frequency ($\omega_{3DZOR}$) of 3D-ZOR 200 may be represented as the resonant frequency of short-circuited quarter-lambda-long transmission line resonator or inductive stub, indicated as "λ/4". In one example, the shunt impedance per unit cell ($Z_{sh}$) may be represented as input impedance of the stub: $Z_0$ tanh(γl), where $Z_0$ is the characteristic impedance of the microstrip transmission line forming the stub, γ is the complex propagation constant for the microstrip transmission line, and l is the length of the stub. In sum, in this example, the resonant frequency of 3D-ZOR 200 is the same as the resonant frequency of a two-dimensional-ZOR.

Figure 3:
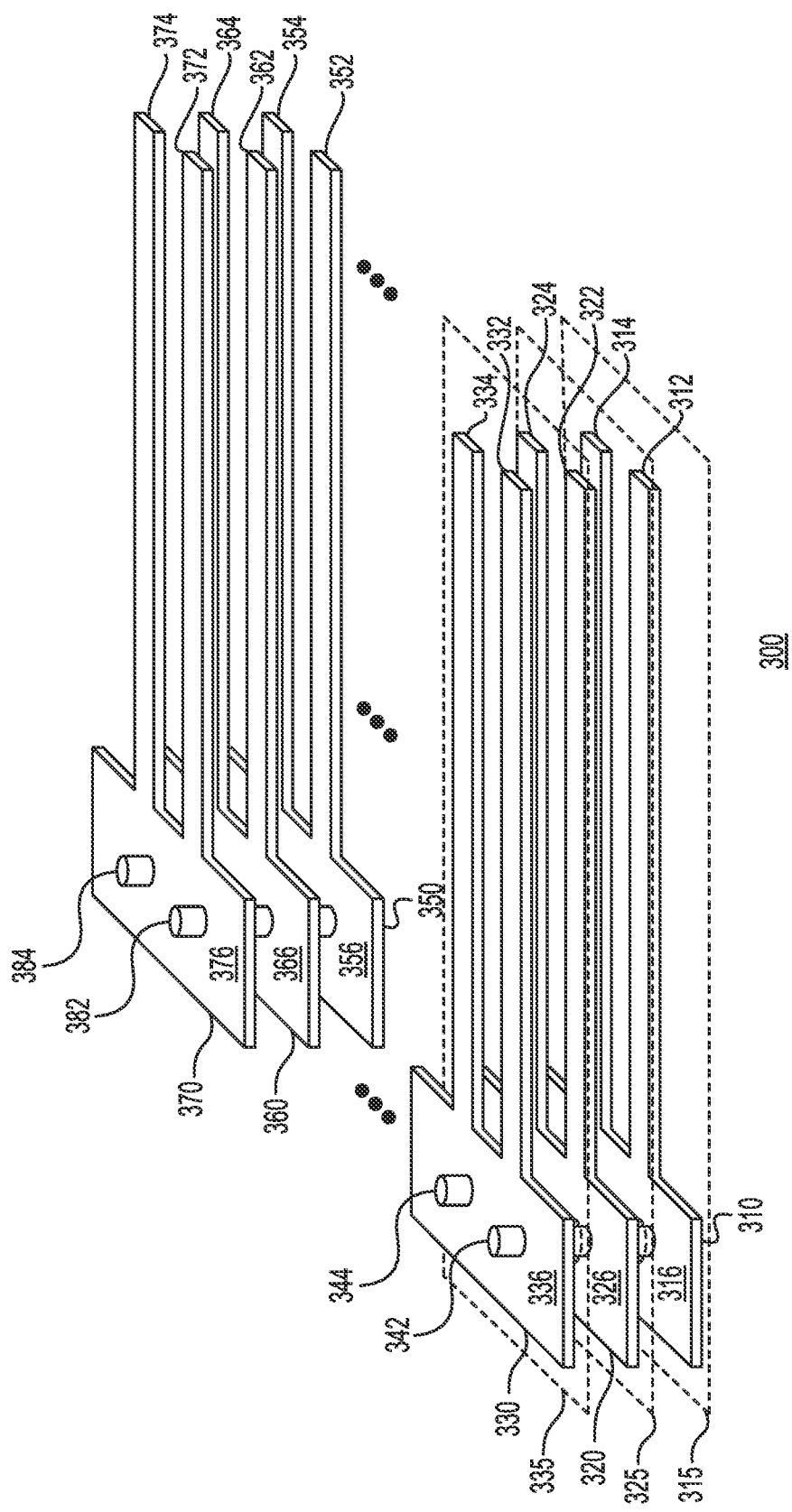
FIG. 3 shows a diagram of a three-dimensional resonant clock network (3D-RCN) in accordance with one example.

FIG. 3 shows a diagram of a three-dimensional resonant clock network (3D-RCN) 300 in accordance with one example. 3D-RCN 300 may include stacks of MTLs connected via short conductors (e.g., through-silicon vias). As an example, one stack of MTLs may include MTLs 310, 320, and 330. 3D-RCN 300 may further include a corresponding ground plane for each of the MTLs. Thus, in this example, ground plane 315 may correspond to MTL 310, ground plane 325 may correspond to MTL 320, and ground plane 335 may correspond to MTL 330. Each of the ground planes may extend laterally across the entire chip including 3D-RCN 300. Another stack of MTLs may include MTLs 350, 360, and 370. In this example, MTL 310 includes stubs 312 and 314. MTL 310 further incudes a spine 316 for stubs 312 and 314. MTL 320 includes stubs 322 and 324. MTL 320 further incudes a spine 326 for stubs 322 and 324. MTL 330 includes stubs 332 and 334. MTL 330 further incudes a spine 336 for stubs 332 and 334. The spines of MTL 310, MTL 320, and MTL 330 are coupled using through-silicon vias 342 and 344. Neither of through-silicon vias 342 and 344 may be coupled to any of ground planes 315, 325, or 335.

With continued reference to FIG. 3, MTL 350 includes stubs 352 and 354. MTL 350 further incudes a spine 356 for stubs 352 and 354. MTL 360 includes stubs 362 and 364. MTL 360 further incudes a spine 366 for stubs 362 and 364. MTL 370 includes stubs 372 and 374. MTL 370 further incudes a spine 376 for stubs 372 and 374. The spines of MTL 350, MTL 360, and MTL 370 are coupled using through-silicon vias 382 and 384. Each of these MTLs may be formed by using any superconductor (e.g., Niobium), any normal metal (e.g., copper or aluminum), or any combination of such metals. An example MTL may include fifty-six 1-mm long unit cells (e.g., unit cell 110 of FIG. 1). Each such unit cell may have a parallel plate capacitor portion (e.g., the spine portion) that is shunted by two 1.8-mm long stubs of 20-μm thick dielectric with a dielectric constant of 4.2. Of course, MTLs could have other lengths with different dimensions for the various unit cells. The unit cell may be repeated 100 times or more, as needed to fill the required area. In one example, the capacitance of the spine may be considered negligible and the zeroth-order resonance may be a pure quarter wave resonance.

Each of the stubs may form clock lines for distributing clock and power signals. Each stub may be grounded at the respective end to a ground plane (e.g., one of ground planes 315, 325, and 335) using a via (not shown). Each stub may be formed by a short-circuited transmission line of up to λ/4 long, where λ is the wavelength of the clock signal. In this example, each of the spines may be formed by a microstrip transmission line that is open-circuited on both ends. As needed, any number of unit cells may be connected in series to form a transmission line. The shunt inductance for each MTL may correspond to the clock-line powering up a respective RQL gate using inductively coupled transformers. In one example, the shunt impedance per unit cell ($Z_{sh}$) may be represented as input impedance of the stub: $Z_0$ tanh(γl), where $Z_0$ is the characteristic impedance of the microstrip transmission line forming the stub, γ is the complex propagation constant for the microstrip transmission line, and l is the length of the stub. Although FIG. 3 shows a certain number of MTLs arranged in a certain manner as part of 3D-RCN 300, there could be additional or fewer number of MTLs arranged differently. As an example, although FIG. 3 relates to three chips containing the stacked MTLs, any number of chips including up to fourteen chips may be stacked.

Figure 4:
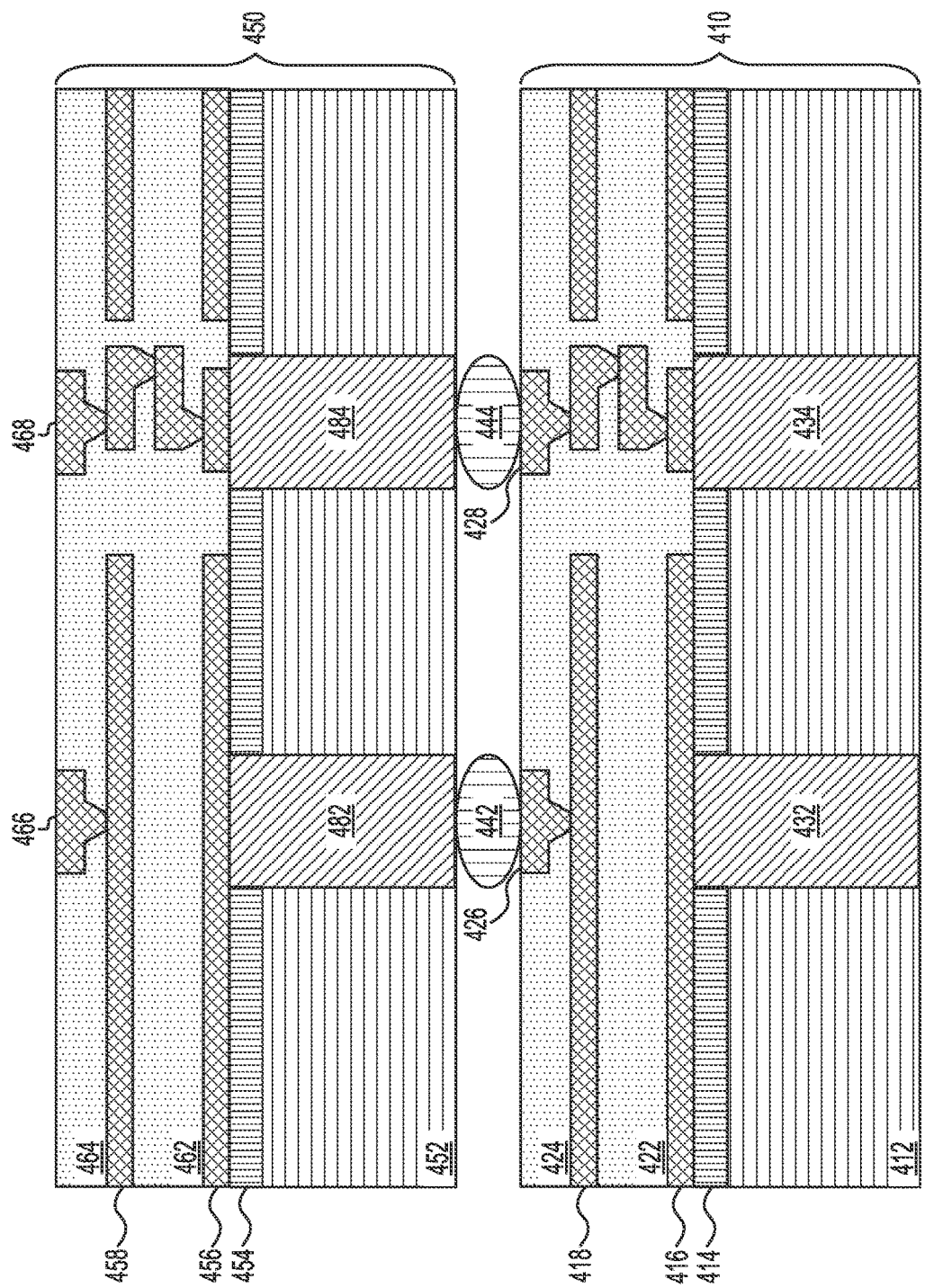
FIG. 4 shows a cross section view of vertically stacked superconducting integrated circuits in accordance with one example.

FIG. 4 shows a cross section view 400 of vertically stacked superconducting integrated circuits in accordance with one example. View 400 shows two superconducting integrated circuits that are stacked vertically: superconducting integrated circuit (SIC) 410 and superconducting integrated circuit (SIC) 450. Each of SIC 410 and SIC 450 may be formed using semiconductor and superconducting manufacturing techniques, including forming circuits by patterning different types of materials on a wafer. SIC 410 may include an oxide layer 414 formed in a substrate 412. SIC 410 may further include a first metal layer 416, which may be formed using atomic layer deposition or by patterning and etching. In this example, metal layer 416 may be formed using niobium. Any other superconducting metal or alloy may also be used. As an example, a normal metal (e.g., copper or aluminum) may also be used. SIC 410 may further include an inter-layer dielectric (ILD) layer 422. Both high-k and low-k dielectrics may be used. As an example, silicon dioxide, silicon nitride, air gaps, or other types of insulators may be used as dielectrics. An additional meta layer 418 may be formed. In this example, metal layer 418 may be formed using niobium. Any other superconducting metal or alloy may also be used. As an example, a normal metal (e.g., copper or aluminum) may also be used. SIC 410 may further include an inter-layer dielectric (ILD) layer 424. Both high-k and low-k dielectrics may be used. Additional layers of metal and dielectric materials may be formed. Vias may be used to connect metal connections in the different layers. As an example, via 426 may be used to connect metal layer 418 to an indium bump 442 and via 428 may be used to connect metal layer 416 to an indium bump 444. One of the resonant networks from 3D-ZOR 300 may be formed as part of SIC 410 to distribute clock and power signals to superconducting circuits formed as part of SIC 410. Through-silicon via 432 and through-silicon via 434 may also be formed. The through-silicon vias may be used to connect the resonant clock network in SIC 410 to resonant network in another superconducting integrated circuit.

With continued reference to FIG. 4, SIC 450 may include an oxide layer 454 formed in a substrate 452. SIC 450 may further include a first metal layer 456, which may be formed using atomic layer deposition or by patterning and etching. In this example, metal layer 456 may be formed using niobium. Any other superconducting metal or alloy may also be used. As an example, a normal metal (e.g., copper or aluminum) may also be used. SIC 450 may further include an inter-layer dielectric (ILD) layer 462. Both high-k and low-k dielectrics may be used. As an example, silicon dioxide, silicon nitride, air gaps, or other types of insulators may be used as dielectrics. An additional meta layer 458 may be formed. In this example, metal layer 458 may be formed using niobium. Any other superconducting metal or alloy may also be used. As an example, a normal metal (e.g., copper or aluminum) may also be used. SIC 450 may further include an inter-layer dielectric (ILD) layer 464. Both high-k and low-k dielectrics may be used. Additional layers of metal and dielectric materials may be formed. Vias may be used to connect metal connections in the different layers. As an example, via 466 may be used to connect metal layer 458 to an external connection (e.g., an indium bump) and via 468 may be used to connect metal layer 456 to an external connection (e.g., an indium bump). Another one of the resonant clock networks from 3D-ZOR 300 may be formed as part of SIC 450 to distribute clock and power signals to superconducting circuits formed as part of SIC 450. Through-silicon via 482 and through-silicon via 484 may also be formed. The through-silicon vias may be used to connect the resonant clock network in SIC 450 to the resonant clock network in SIC 410.

Although FIG. 4 shows only two stacked superconducting integrated circuits, such an apparatus may include additional vertically stacked superconducting integrated circuits. In addition, although SIC 410 and SIC 450 are shown as having a certain number of layers arranged in a certain manner, SIC 410 and SIC 450 may include additional or fewer layers arranged differently. In addition, SIC 410 may be configured to provide a different functionality (e.g., processor functionality) from the functionality provided by SIC 450 (e.g., memory functionality). Although FIG. 4 shows SIC 410 and SIC 450 interconnected vertically using indium bumps, SIC 410 and SIC 450 may be vertically stacked using different techniques. As an example, SIC 410 and SIC 450 may be formed as separate dies and then aligned and bonded. As another example, SIC 450 may be formed and then bonded to a wafer comprising SIC 450. After this step, wafer comprising SIC 450 may be separated into vertically stacked integrated circuits. As yet another example, SIC 410 and SIC 450 may be bonded to each other using a wafer-to-wafer bonding technique. Vertical connectors, such as through-silicon vias may be formed before or after the bonding of two different dies, two different wafers, or a die to a wafer.

In order to create a resonant clock network (RCN) that is capable of distributing the RF clock and power across an entire RQL chip or a vertical stack of such chips, multiple MTLs may need to be synchronized in both amplitude and phase. As an example, two MTLs may be synchronized with a half-lambda ($\lambda/2$) long transmission line connecting their spines. Alternatively, the synchronization may be achieved with a half-lambda ($\lambda/2$) long transmission line connecting the clock-lines with the shorts removed. As discussed earlier, an RQL-logic compatible chip may require two dock signals in quadrature, also referred to as the in-phase (I) clock signals and the quadrature (Q) clock signals.

Figure 5:
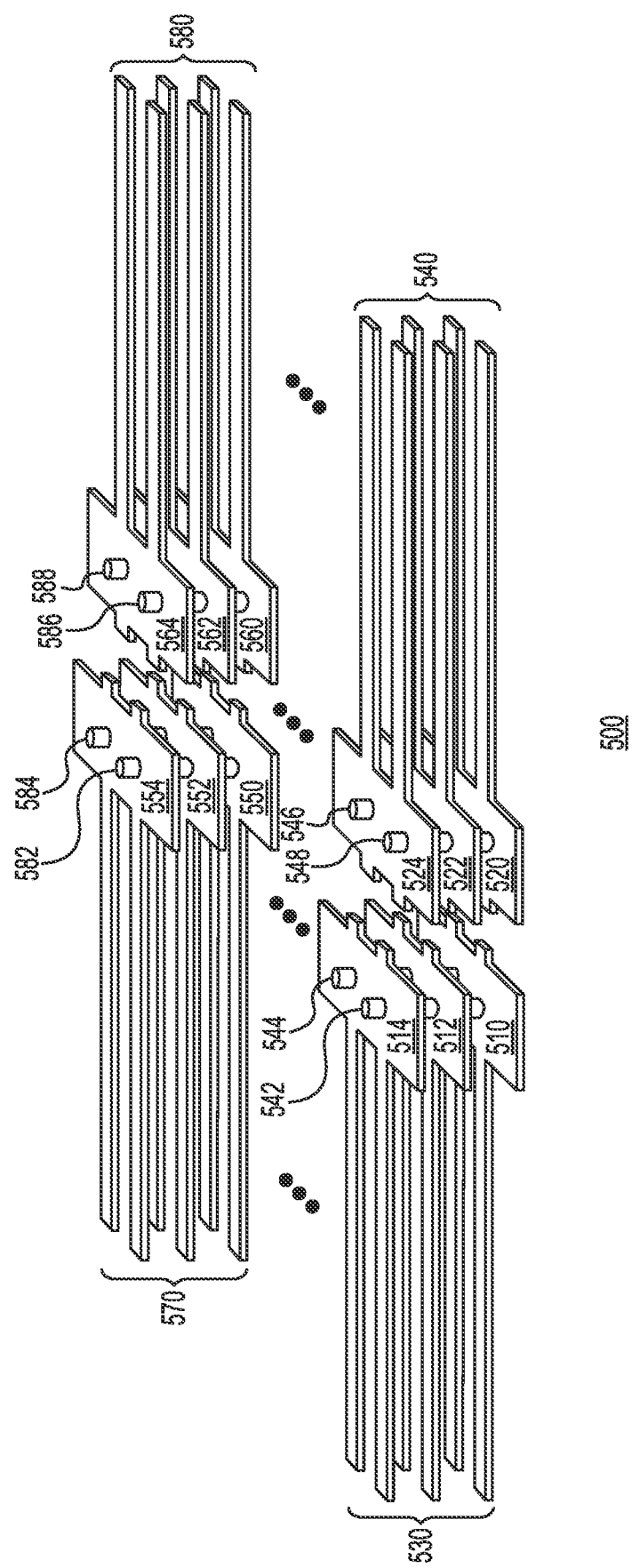
FIG. 5 shows a diagram of a double-sided three-dimensional resonant clock network (3D-RCN) in accordance with one example.

FIG. 5 shows a diagram of a double-sided three-dimensional resonant clock network (3D-RCN) 500 in accordance with one example. Double-sided 3D-RCN 500 may include stacks of MTLs connected via short conductors (e.g., through-silicon vias), which may be double-sided as shown in FIG. 5. Thus, in this example, sides 530 and 570 may be on the left side and sides 540 and 580 may be on the right side. The spines of the MTLs located opposite sides may be connected using vias (not shown) or other types of connections. As an example, the spines located on opposite sides, including spines 510 and 520 may be coupled, spines 512 and 522 may be coupled, and spines 514 and 524 may be coupled. Similarly, the spines located on opposite sides, including spines 550 and 560 may be coupled, spines 552 and 562 may be coupled, and spines 554 and 564 may be coupled.

With continued reference to FIG. 5, spines 510, 512, and 514 may be coupled using through-silicon vias 542 and 544. Spines 520, 522, and 524 may be coupled using through-silicon vias 546 and 548. Spines 550, 552, and 554 may be coupled using through-silicon vias 582 and 584. Spines 560, 562, and 564 may be coupled using through-silicon vias 586 and 588. Each of these MTLs may be formed by using any superconductor (e.g., Niobium), any normal metal (e.g., copper or aluminum), or any combination of such metals. An example MTL may include fifty-six 1-mm long unit cells (e.g., unit cell 110 of FIG. 1). Of course, MTLs could have other lengths with different dimensions for the various unit cells. The unit cell may be repeated 100 times or more, as needed to fill the required area. In one example, the capacitance of the spine may be considered negligible and the zeroth-order resonance may be a pure quarter wave resonance.

Each of the stubs may form clock lines for distributing clock and power signals. Each stub may be grounded at the respective end to a ground plane using a via (not shown). Each stub may be formed by a short-circuited transmission line of up to $\lambda/4$ long, where $\lambda$ is the wavelength of the clock signal. In this example, each of the spines may be formed by a microstrip transmission line that is open-circuited on both ends. As needed, any number of unit cells may be connected in series to form a transmission line. The shunt inductance for each MTL may correspond to the clock-line powering up a respective RQL gate using inductively coupled transformers. Although FIG. 5 shows a certain number of MTLs arranged in a certain manner as part of 3D-RCN 500, there could be additional or fewer number of MTLs arranged differently. In addition, although FIG. 5 does not show any ground planes, 3D-RCN 500 may include ground planes similar to grounds planes 315, 325, and 335 shown as part of FIG. 3.

Figure 6:
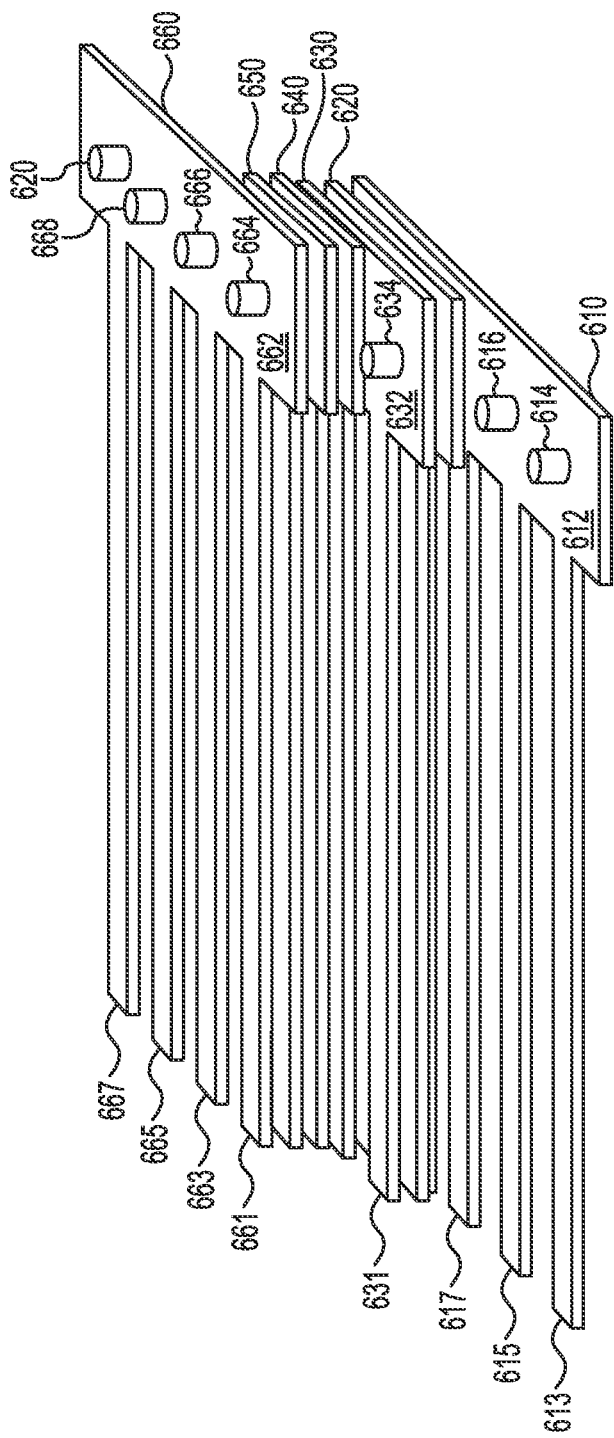
FIG. 6 shows a diagram of another three-dimensional resonant clock network (3D-RCN) in accordance with one example.

FIG. 6 shows a diagram of another three-dimensional resonant clock network (3D-RCN) 600 in accordance with one example. 3D-RCN 600 may include MTLs that have spines forming a staircase topology. In this example, 3D-RCN 600 may include stacks of MTLs connected via short conductors (e.g., through-silicon vias). MTLs 610, 620, 630, 640, 650, and 660 may be arranged in a manner that the spines of these MTLs form a staircase topology. In this example, MTL 610 includes stubs 613, 615, and 617. MTL 610 further incudes a spine 612 for stubs 613, 615, and 617. The spine of MTL 610 is also shown including through-silicon vias 614 and 616. These vias may be used to couple MTL 610 to a clock signal and a ground plane, respectively. MTL 620 is stacked in a staircase fashion on top of MTL 610. MTL 630 includes stubs 631 and other stubs that are not shown. MTL 630 further incudes a spine 632 for the stubs associated with spine 632, including stub 631. The spines of MTL 610, MTL 620, and MTL 630 are coupled using through-silicon via 634. MTL 640 is stacked in a staircase fashion on top of MTL 630. MTL 650 is also stacked in a staircase fashion on top of MTL 640. MTL 660 is stacked on MTL 650 in a staircase fashion. MTL 660 includes stubs 661, 663, 665, and 667. MTL 660 further incudes a spine 662 for stubs 661, 663, 665, and 667. The spines of MTL 630, MTL 640, MTL 650, and MTL 660 are coupled using through-silicon vias 664 and 666. Through-silicon vias 668 and 670 are coupled to spine 662 of MTL 660 as well. These vias may be used to couple 3D-RCN 600 to other integrated circuits or other portions of an integrated circuit, as needed.

Each of these MTLs may be formed by using any superconductor (e.g., Niobium), any normal metal (e.g., copper or aluminum), or any combination of such metals. An example MTL may include fifty-six 1-mm long unit cells (e.g., unit cell 110 of FIG. 1). Each such unit cell may have a parallel plate capacitor portion (e.g., the spine portion) that is shunted by two 1.8-mm long stubs of 20-μm thick dielectric with a dielectric constant of 4.2. Of course, MTLs could have other lengths with different dimensions for the various unit cells. The unit cell may be repeated 100 times or more, as needed to fill the required area. In one example, the capacitance of the spine may be considered negligible and the zeroth-order resonance may be a pure quarter wave resonance.

Each of the stubs may form clock lines for distributing clock and power signals. Each stub may be grounded at the respective end to a ground plane using a via (not shown). Each stub may be formed by a short-circuited transmission line of up to λ/4 long, where λ is the wavelength of the clock signal. In this example, each of the spines may be formed by a microstrip transmission line that is open-circuited on both ends. As needed, any number of unit cells may be connected in series to form a transmission line. The shunt inductance for each MTL may correspond to the clock-line powering up a respective RQL gate using inductively coupled transformers. In one example, the shunt impedance per unit cell ($Z_{sh}$) may be represented as input impedance of the stub: $Z_0$ tanh($\gamma l$), where $Z_0$ is the characteristic impedance of the microstrip transmission line forming the stub, $\gamma$ is the complex propagation constant for the microstrip transmission line, and l is the length of the stub. Although FIG. 6 shows a certain number of MTLs arranged in a certain manner as part of 3D-RCN 600, there could be additional or fewer number of MTLs arranged differently. In addition, although FIG. 6 does not show any ground planes, 3D-RCN 600 may include ground planes similar to grounds planes 315, 325, and 335 shown as part of FIG. 3.

Figure 7:
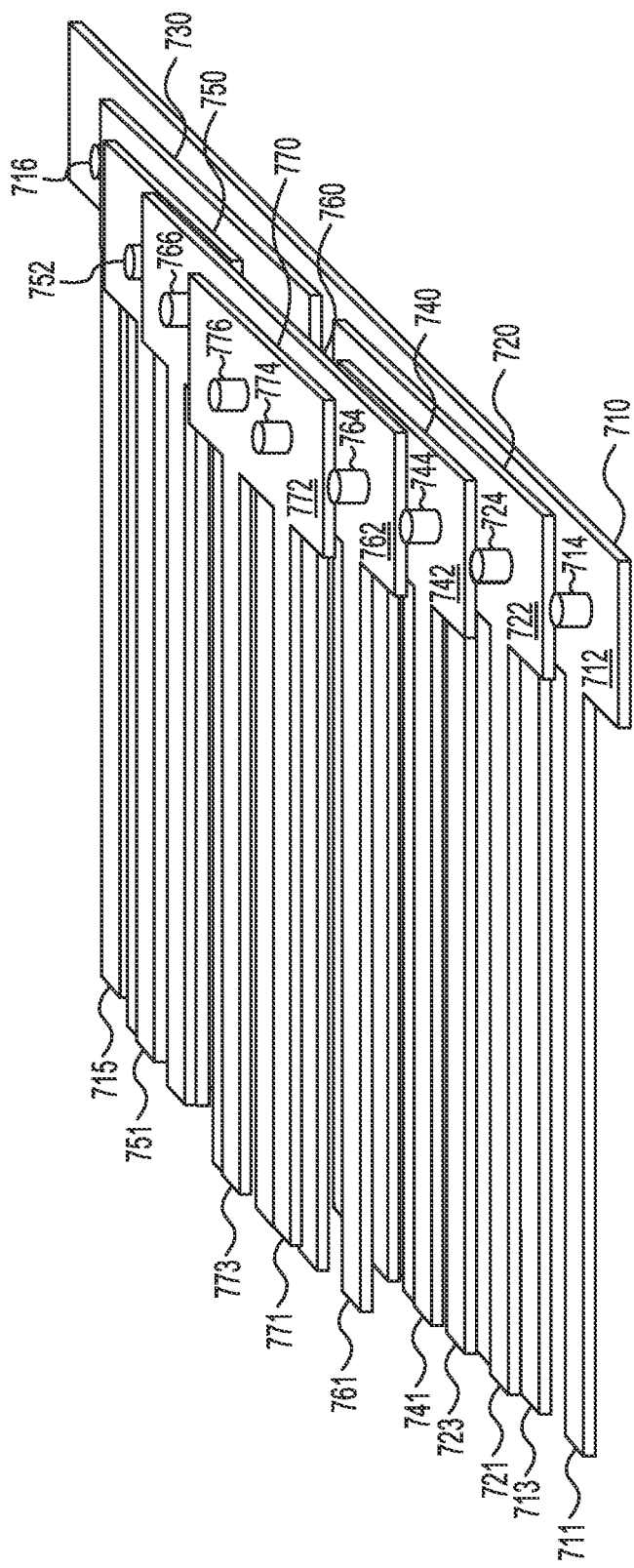
FIG. 7 shows a diagram of another three-dimensional resonant clock network (3D-RCN) in accordance with one example.

FIG. 7 shows a diagram of another three-dimensional resonant clock network (3D-RCN) 700 in accordance with one example. 3D-RCN 700 may include MTLs that have spines forming a $2^{nd}$ degree Δ-fractal topology. In this example, 3D-RCN 700 may include stacks of MTLs connected via short conductors (e.g., through-silicon vias). MTLs 710, 720, 730, 740, 750, and 760 may be arranged in a manner that the spines of these MTLs form a $2^{nd}$ degree Δ-fractal topology. In this example, MTL 710, which is the bottom most MTL, includes stubs 711 and 713, and other stubs that are not shown. MTL 710 further incudes a spine 712 for its stubs. The spine of MTL 710 is also shown including through-silicon vias 714 and 716. These vias may be used to couple MTL 710 to a clock signal and a ground plane, respectively. MTLs 720 and 730 are stacked in a $2^{nd}$ degree Δ-fractal fashion on top of MTL 710. MTL 720 includes stubs 721, 723, and other stubs that are not shown. MTL 720 further incudes a spine 722 for the stubs associated with it. Similarly, although not specifically identified in FIG. 7, MTL 730 also includes spines and stubs. The spines of MTL 710, MTL 720, and MTL 730 are coupled using through-silicon vias, including through-silicon via 724.

With continued reference to FIG. 7, MTL 740 and MTL 750 are stacked in a similar topology on top of MTL 720 and MTL 730, respectively. MTL 760 and MTL 770 are also stacked to maintain the $2^{nd}$ degree Δ-fractal topology. MTL 740 includes stubs 741 and other stubs that are not visible or shown. MTL 740 further incudes a spine 742 for the associated stubs. MTL 750 includes stubs 751 and other stubs that are not visible or shown. MTL 750 further incudes a spine for the associated stubs. The spines of MTL 730 and MTL 750 are coupled using at least through-silicon via 752. MTL 760 includes stubs 761 and other stubs that are not visible or shown. MTL 760 further includes a spine 762 for the associated stubs. The spines of MTL 720 and MTL 740 are coupled using at least through-silicon via 744. MTL 770 further includes stubs 771 and 773. MTL 770 further includes a spine for stubs 771 and 773. The spines of MTL 760 and 770 are coupled using through-silicon vias 774 and 776. Through-silicon vias 774 and 776 may be used to couple 3D-RCN 700 to other integrated circuits or other portions of an integrated circuit, as needed, via MTL 770.

Each of these MTLs may be formed by using any superconductor (e.g., Niobium), any normal metal (e.g., copper or aluminum), or any combination of such metals. An example MTL may include fifty-six 1-mm long unit cells (e.g., unit cell 110 of FIG. 1). Each such unit cell may have a parallel plate capacitor portion (e.g., the spine portion) that is shunted by two 1.8-mm long stubs of 20-μm thick dielectric with a dielectric constant of 4.2. Of course, MTLs could have other lengths with different dimensions for the various unit cells. The unit cell may be repeated 100 times or more, as needed to fill the required area. In one example, the capacitance of the spine may be considered negligible and the zeroth-order resonance may be a pure quarter wave resonance.

Each of the stubs may form clock lines for distributing clock and power signals. Each stub may be grounded at the respective end to a ground plane using a via (not shown). Each stub may be formed by a short-circuited transmission line of up to λ/4 long, where λ is the wavelength of the clock signal. In this example, each of the spines may be formed by a microstrip transmission line that is open-circuited on both ends. As needed, any number of unit cells may be connected in series to form a transmission line. The shunt inductance for each MTL may correspond to the clock-line powering up a respective RQL gate using inductively coupled transformers. In one example, the shunt impedance per unit cell ($Z_{sh}$) may be represented as input impedance of the stub: $Z_0$ tanh($\gamma l$), where $Z_0$ is the characteristic impedance of the microstrip transmission line forming the stub, $\gamma$ is the complex propagation constant for the microstrip transmission line, and l is the length of the stub. Although FIG. 7 shows a certain number of MTLs arranged in a certain manner as part of 3D-RCN 700, there could be additional or fewer number of MTLs arranged differently. As an example, other topologies for the 3D-RCNs may also be used. As an example, the MTLs may be arranged in a hexagonal topology of the spines associated with the MTLs. In addition, although FIG. 7 does not show any ground planes, 3D-RCN 700 may include ground planes similar to grounds planes 315, 325, and 335 shown as part of FIG. 3. In addition, although not shown in FIG. 3, FIG. 5, FIG. 6, or FIG. 7, any of these resonant clock networks included as part of a first superconducting integrated circuit may be coupled to another resonant clock network in a second superconducting integrated circuit by interconnecting the through-silicon vias using bumps or similar structures.

In any of the 3D-RCNs (e.g., 3D-RCN 300, 3D-RCN 600, and 3D-RCN 700) described earlier, even if the 3D stacked integrated circuits include a mix of logic and memory chips, the 3D-ZOR can still synchronize the respective clocks into a single 3D-RCN as long as the partial resonant frequencies of the individual integrated circuit chips are sufficiently close to each other. In any of the 3D-RCNs (e.g., 3D-RCN 300, 3D-RCN 600, and 3D-RCN 700) described earlier, the through-silicon vias may be formed using niobium or any other normal metal (e.g., Copper). Because the inductor $L_1$ (shown in FIG. 2) carries almost no radio frequency current, even a lossy through-silicon via does not significantly reduce the Q-factor of the superconducting 3D-ZOR. Modeling of the 3D-RCN with stacked MTLs shows that a Q-factor of 658000 can be realized with the copper through-silicon vias.

Advantageously, assuming a chip thickness of 50 μm (limited by the length of the through-silicon vias) and the maximum two-dimensional spine size of 10×10 mm (limited by the parasitic non-ZOR modes), a 3D stacked integrated circuit (3D-SIC) could have as many as 200 chips. Assuming a 10×10 mm chip size, a single 3D-SIC may have the same number of gates as a 15×15 cm multi-chip module (MCM). Accordingly, a 15×15 cm MCM populated with such 3D-SICs could replace as many as 200 MCMs. In addition, cooling a 1×1×1 cm 3D-SIC requires much less power and hence a cheaper system than required for cooling a 15×15 cm MCM.

Additional cost reduction could be realized because of the decrease in the Ohmic loss. Unlike the electrically long links connecting chips in an MCM based system, the 2D spine of 3D ZOR made of electrically short through-silicon vias carries almost no RF current and therefore introduces no extra loss. This, in turn, further reduces the power required to cool the entire set of circuits down to the operating cryogenic temperature.

In conclusion, in one example, the present disclosure relates to an apparatus including a first superconducting integrated circuit having a first clock distribution network for distributing a first clock signal in the first superconducting integrated circuit. The apparatus may further include a second superconducting integrated circuit, stacked on top of the first superconducting integrated circuit, having a second clock distribution network for distributing a second clock signal in the second superconducting integrated circuit, where each of the first clock distribution network and the second clock distribution network comprises a clock structure having a plurality of unit cells, where each of the plurality of unit cells includes at least one spine and at least one stub, the at least one spine connected to the at least one stub, the at least one stub further inductively coupled to at least one first superconducting circuit, and where each of the first clock signal and the second clock signal has a same resonant frequency.

The same resonant frequency may correspond to a wavelength, and each of a plurality of unit cells may be spaced apart from each other along the clock structure by a distance, where the distance is less than one tenth of the wavelength. The first clock distribution network may include a first plurality of metamaterial transmission lines (MTLs) and the second clock distribution network may include a second plurality of MTLs, where the first clock distribution network comprises a first plurality of metamaterial transmission lines (MTLs) having a first set of spines and the second clock distribution network comprises a second plurality of MTLs having a second set of spines, and where at least one spine associated with one of the first plurality of MTLs is coupled to at least one spine associated with one of the second plurality of MTLs via a through-silicon via.

The first set of spines and the second set of spines may be arranged in a staircase topology. In another example, the first set of spines and the second set of spines may be arranged in a fractal topology.

Each of the first superconducting integrated circuit and the second superconducting integrated circuit may further comprise a transformer for inductively coupling at least one first superconducting circuit to at least one stub. The first superconducting integrated circuit may include a first set of reciprocal quantum logic gates and where the first clock signal may comprise an alternating current (AC) signal for providing power to the first set of reciprocal quantum logic gates, and where the second superconducting integrated circuit may comprise a second set of reciprocal quantum logic gates and where the second clock signal comprises an AC signal for providing power to the second set of reciprocal quantum logic gates.

In another aspect, the present disclosure relates to an apparatus comprising a first superconducting integrated circuit having a first clock distribution network for distributing a first clock signal in the first superconducting integrated circuit, where the first superconducting integrated circuit comprises a first plurality of reciprocal quantum logic gates. The apparatus may further include a second superconducting integrated circuit, stacked on top of the first superconducting integrated circuit, having a second clock distribution network for distributing a second clock signal in the second superconducting integrated circuit, where the second superconducting integrated circuit comprises a second plurality of reciprocal quantum logic gates, where each of the first clock distribution network and the second clock distribution network comprises a clock structure having a plurality of unit cells, where each of the plurality of unit cells includes at least one spine and at least one stub, the at least one spine connected to the at least one stub, the at least one stub further inductively coupled to at least one first superconducting circuit, and where each of the first clock signal and the second clock signal has a same resonant frequency.

The same resonant frequency may correspond to a wavelength, and each of a plurality of unit cells may be spaced apart from each other along the clock structure by a distance, where the distance is less than one tenth of the wavelength. The first clock distribution network may comprise a first plurality of metamaterial transmission lines (MTLs) and the second dock distribution network may comprise a second plurality of MTLs, where the first clock distribution network comprises a first plurality of metamaterial transmission lines (MTLs) having a first set of spines and the second clock distribution network comprises a second plurality of MTLs having a second set of spines, and where at least one spine associated with one of the first plurality of MTLs is coupled to at least one spine associated with one of the second plurality of MTLs via a through-silicon via.

The first set of spines and the second set of spines may be arranged in a staircase topology. In another example, the first set of spines and the second set of spines may be arranged in a fractal topology.

Each of the first superconducting integrated circuit and the second superconducting integrated circuit may further comprise a transformer for inductively coupling at least one first superconducting circuit to at least one stub. The first clock signal may comprise an alternating current (AC) signal for providing power to the first set of reciprocal quantum logic gates, and the second clock signal may comprise an AC signal for providing power to the second set of reciprocal quantum logic gates, and where each of the first plurality of reciprocal quantum logic gates and the second plurality of reciprocal quantum logic gates may be configured to process single-flux quantum (SFQ) pulses.

In yet another aspect, the present disclosure relates to an apparatus comprising a first superconducting integrated circuit having a first clock distribution network for distributing a first clock signal in the first superconducting integrated circuit. The apparatus may further include a second superconducting integrated circuit, stacked on top of the first superconducting integrated circuit, having a second clock distribution network for distributing a second clock signal in the second superconducting integrated circuit, where the first clock distribution network and the second clock distribution network form a volumetric zeroth-order resonator, where each of the first clock distribution network and the second clock distribution network comprises a clock structure having a plurality of unit cells, where each of the plurality of unit cells includes at least one spine and at least one stub, the at least one spine connected to the at least one stub, the at least one stub further inductively coupled to at least one first superconducting circuit, where each of the first clock signal and the second clock signal has a same resonant frequency, where the first clock distribution network comprises a first plurality of metamaterial transmission lines (MTLs) and the second clock distribution network comprises a second plurality of MTLs, and where a first plurality of spines associated with the first plurality of MTLs is coupled to a second plurality of spines associated with the second plurality of MTLs via at least one through-silicon via.

The same resonant frequency may correspond to a wavelength, and each of a plurality of unit cells is spaced apart from each other along the clock structure by a distance, where the distance is less than one tenth of the wavelength. The first plurality of spines and the second plurality of spines may be arranged in a staircase topology. In another example, the first plurality of spines and the second plurality of spines may be arranged in a fractal topology.

Each of the first superconducting integrated circuit and the second superconducting integrated circuit may further comprise a transformer for inductively coupling at least one first superconducting circuit to at least one stub. The first superconducting integrated circuit may comprise a first set of reciprocal quantum logic gates, where the first clock signal may comprise an alternating current (AC) signal for providing power to the first set of reciprocal quantum logic gates, and the second superconducting integrated circuit may comprise a second set of reciprocal quantum logic gates, and where the second clock signal may comprise an AC signal for providing power to the second set of reciprocal quantum logic gates.

It is to be understood that the modules and components depicted herein are merely exemplary. Alternatively, or in addition, the functionality described herein can be integrated, at least in part, with one or more hardware logic components. For example, and without limitation, illustrative types of hardware logic components that can be used include Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs), etc. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

The functionality associated with the examples described in this disclosure can also include instructions stored in a non-transitory media. The term "non-transitory media" as used herein refers to any media storing data and/or instructions that cause a machine, such as a superconducting integrated circuit, to operate in a specific manner. Exemplary non-transitory media include non-volatile media and/or volatile media. Non-volatile media include, for example, a hard disk, a solid state drive, a magnetic disk or tape, an optical disk or tape, a flash memory, an EPROM, NVRAM, PRAM, or other such media, or networked versions of such media. Volatile media include, for example, dynamic memory, such as, DRAM, SRAM, a cache, or other such media. Non-transitory media is distinct from, but can be used in conjunction with transmission media. Transmission media is used for transferring data and/or instruction to or from a machine. Exemplary transmission media, include coaxial cables, fiber-optic cables, copper wires, and wireless media, such as radio waves.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed:

1. An apparatus comprising:
a first superconducting integrated circuit having a first clock distribution network for distributing a first clock signal in the first superconducting integrated circuit; and
a second superconducting integrated circuit, stacked on top of the first superconducting integrated circuit, having a second clock distribution network for distributing a second clock signal in the second superconducting integrated circuit, wherein the first clock distribution network comprises a first clock structure having a first plurality of unit cells and the second clock distribution network comprises a second clock structure having a second plurality of unit cells, wherein each of the first plurality of unit cells includes at least one first spine and at least one first stub, the at least one first spine connected to the at least one first stub, the at least one first stub further inductively coupled to at least one circuit within the first superconducting integrated circuit, wherein each of the second plurality of unit cells includes at least one second spine and at least one second stub, the at least one second stub further inductively coupled to at least one circuit within the second superconducting integrated circuit, and wherein each of the first clock signal and the second clock signal has a clock frequency selected to be equal to a resonant frequency of each of the first clock structure and the second clock structure.

2. The apparatus of claim 1, wherein the resonant frequency corresponds to a wavelength, and wherein each of the first plurality of unit cells is spaced apart from each other along the first clock structure by a first distance, wherein each of the second plurality of unit cells is spaced apart from each other along the second clock structure by a second distance, and wherein each of the first distance and the second distance is less than one tenth of the wavelength.

3. The apparatus of claim 1, wherein the first clock distribution network comprises a first plurality of metamaterial transmission lines (MTLs) and the second clock distribution network comprises a second plurality of MTLs, wherein the first clock distribution network comprises a first plurality of metamaterial transmission lines (MTLs) having a first set of spines and the second clock distribution network comprises a second plurality of MTLs having a second set of spines, and wherein at least one spine associated with one of the first plurality of MTLs is coupled to at least one spine associated with one of the second plurality of MTLs via a through-silicon via.

4. The apparatus of claim 3, wherein the first set of spines and the second set of spines are arranged in a staircase topology.

5. The apparatus of claim 3, wherein the first set of spines and the second set of spines are arranged in a fractal topology.

6. The apparatus of claim 3, wherein the first plurality of MTLs and the second plurality of MTLs are arranged as part of a three-dimensional resonant clock network.

7. The apparatus of claim 1, wherein the first superconducting integrated circuit comprises a first set of reciprocal quantum logic gates and wherein the first clock signal comprises an alternating current (AC) signal for providing power to the first set of reciprocal quantum logic gates, and wherein the second superconducting integrated circuit comprises a second set of reciprocal quantum logic gates and wherein the second clock signal comprises an AC signal for providing power to the second set of reciprocal quantum logic gates.

8. An apparatus comprising:
a first superconducting integrated circuit having a first clock distribution network for distributing a first clock signal in the first superconducting integrated circuit, wherein the first superconducting integrated circuit comprises a first plurality of reciprocal quantum logic gates, wherein the first clock distribution network comprises a first clock structure having a first plurality of unit cells, and wherein each of the first plurality of unit cells includes at least one first spine and at least one first stub, the at last one first spine connected to the at least one first stub, the at least one first stub inductively coupled to at least one of the first plurality of reciprocal quantum logic gates; and
a second superconducting integrated circuit, stacked on top of the first superconducting integrated circuit, having a second clock distribution network for distributing a second clock signal in the second superconducting integrated circuit, wherein the second superconducting integrated circuit comprises a second plurality of reciprocal quantum logic gates, wherein the second clock distribution network comprises a second clock structure having a second plurality of unit cells, wherein each of the second plurality of unit cells includes at least one second spine and at least one second stub, the at least one second spine connected to the at least one second stub, the at least one second stub further inductively coupled to at least one of the second plurality of reciprocal quantum logic gates, and wherein each of the first clock signal and the second clock signal has a clock frequency selected to be equal to a resonant frequency of each of the first clock structure and the second clock structure.

9. The apparatus of claim 8, wherein the resonant frequency corresponds to a wavelength, and wherein each of the first plurality of unit cells is spaced apart from each other along the first clock structure by a first distance, wherein each of the second plurality of unit cells is spaced apart from each other along the second clock structure by a second distance, and wherein each of the first distance and the second distance is less than one tenth of the wavelength.

10. The apparatus of claim 8, wherein the first clock distribution network comprises a first plurality of metamaterial transmission lines (MTLs) and the second clock distribution network comprises a second plurality of MTLs, wherein the first clock distribution network comprises a first plurality of metamaterial transmission lines (MTLs) having a first set of spines and the second clock distribution network comprises a second plurality of MTLs having a second set of spines, and wherein at least one spine associated with one of the first plurality of MTLs is coupled to at least one spine associated with one of the second plurality of MTLs via a through-silicon via.

11. The apparatus of claim 10, wherein the first set of spines and the second set of spines are arranged in a staircase topology.

12. The apparatus of claim 10, wherein the first set of spines and the second set of spines are arranged in a fractal topology.

13. The apparatus of claim 10, wherein the first plurality of MTLs and the second plurality of MTLs are arranged as part of a three-dimensional resonant clock network.

14. The apparatus of claim 8, wherein the first clock signal comprises an alternating current (AC) signal for providing power to the first plurality of reciprocal quantum logic gates, wherein the second clock signal comprises an AC signal for providing power to the second plurality of reciprocal quantum logic gates, and wherein each of the first plurality of reciprocal quantum logic gates and the second plurality of reciprocal quantum logic gates is configured to process single-flux quantum (SFQ) pulses.

15. An apparatus comprising:
a first superconducting integrated circuit having a first clock distribution network for distributing a first clock signal in the first superconducting integrated circuit, wherein the first clock distribution network comprises a first clock structure having a first plurality of unit cells, wherein each of the first plurality of unit cells includes at least one first spine and at least one first stub, the at last one first spine connected to the at least one first stub, the at least one first stub inductively coupled to at least one circuit within the first superconducting integrated circuit; and
a second superconducting integrated circuit, stacked on top of the first superconducting integrated circuit, having a second clock distribution network for distributing a second clock signal in the second superconducting integrated circuit, wherein the first clock distribution network and the second clock distribution network form a volumetric zeroth-order resonator, wherein the second clock distribution network comprises a second clock structure having a second plurality of unit cells, wherein each of the second plurality of unit cells includes at least one second spine and at least one second stub, the at least one second spine connected to the at least one second stub, the at least one second stub further inductively coupled to at least one circuit within the second superconducting integrated circuit, wherein each of the first clock signal and the second clock signal has a clock frequency selected to be equal to a resonant frequency of each of the first clock structure and the second clock structure, wherein the first clock distribution network comprises a first plurality of metamaterial transmission lines (MTLs) and the second clock distribution network comprises a second plurality of MTLs, and wherein a first plurality of spines associated with the first plurality of MTLs is coupled to a second plurality of spines associated with the second plurality of MTLs via at least one through-silicon via.

16. The apparatus of claim 15, wherein the resonant frequency corresponds to a wavelength, and wherein each of the first plurality of unit cells is spaced apart from each other along the first clock structure by a first distance, wherein each of the second plurality of unit cells is spaced apart from each other along the second clock structure by a second distance, and wherein each of the first distance and the second distance is less than one tenth of the wavelength.

17. The apparatus of claim 15, wherein the first plurality of spines and the second plurality of spines are arranged in a staircase topology.

18. The apparatus of claim 15, wherein the first plurality of spines and the second plurality of spines are arranged in a fractal topology.

19. The apparatus of claim 15, wherein the volumetric zeroth-order resonator is configured to distribute the first clock signal and the second clock signal, respectively, with uniform amplitude and phase to circuits within the first superconducting integrated circuit and the second superconducting integrated circuit.

20. The apparatus of claim 15, wherein the first RQL circuit comprises a first set of reciprocal quantum logic gates and wherein the first clock signal comprises an alternating current (AC) signal for providing power to the first set of reciprocal quantum logic gates, and wherein the second RQL circuit comprises a second set of reciprocal quantum logic gates and wherein the second clock signal comprises an AC signal for providing power to the second set of reciprocal quantum logic gates.

* * * * *